US012444359B2

(12) United States Patent
Park et al.

(10) Patent No.: US 12,444,359 B2
(45) Date of Patent: Oct. 14, 2025

(54) DISPLAY APPARATUS OPERATED WITH LOW REFRESH RATE AND METHOD OF DRIVING THE SAME

(71) Applicant: LG Display Co., Ltd., Seoul (KR)

(72) Inventors: Nam-Kil Park, Paju-si (KR); Jung-Min Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 18/414,134

(22) Filed: Jan. 16, 2024

(65) Prior Publication Data

US 2024/0257737 A1 Aug. 1, 2024

(30) Foreign Application Priority Data

Jan. 31, 2023 (KR) ........................ 10-2023-0012455

(51) Int. Cl.

| | |
|---|---|
| ***G09G 3/3233*** | (2016.01) |
| ***G09G 3/20*** | (2006.01) |
| ***H10K 59/131*** | (2023.01) |

(52) U.S. Cl.

CPC ......... *G09G 3/3233* (2013.01); *G09G 3/2092* (2013.01); *H10K 59/131* (2023.02); *G09G 2300/0819* (2013.01); *G09G 2300/0842* (2013.01); *G09G 2300/0857* (2013.01); *G09G 2320/043* (2013.01); *G09G 2340/0435* (2013.01)

(58) Field of Classification Search

CPC ............... G09G 3/3233; G09G 3/2092; G09G 2300/0819; G09G 2300/0842; G09G 2300/0857; G09G 2320/043; G09G 2340/0435; H10K 59/131

See application file for complete search history.

(56) References Cited

U.S. PATENT DOCUMENTS

| | | | | |
|---|---|---|---|---|
| 11,183,106 B2 | 11/2021 | Park et al. | | |
| 2020/0372853 A1 | 11/2020 | Park et al. | | |
| 2021/0407436 A1 * | 12/2021 | Park | ..................... | G09G 3/3233 |
| 2023/0230543 A1 * | 7/2023 | Kim | ..................... | G09G 3/3233 345/691 |

FOREIGN PATENT DOCUMENTS

| | | |
|---|---|---|
| KR | 10-2018-0003736 A | 1/2018 |
| KR | 10-2020-0134387 A | 12/2020 |

* cited by examiner

*Primary Examiner* — Peter D McLoone
(74) *Attorney, Agent, or Firm* — Fenwick & West LLP

(57) ABSTRACT

A display device includes: a timing controlling unit configured to generate an image data, a data control signal and a gate control signal; a data driving unit configured to generate a data signal using the image data and the data control signal; a gate driving unit configured to generate a gate signal using the gate control signal; and a display panel configured to display an image using the data signal and the gate signal, wherein a start signal of the gate control signal has one pulse between a logic high voltage and a logic low voltage during a refresh subframe where the data signal and the gate signal are supplied and has a plurality of pulses between the logic high voltage and the logic low voltage during an anode reset subframe where supply of the data signal and the gate signal is stopped.

11 Claims, 8 Drawing Sheets

FIG. 7

| | applied voltage | | | test time | | |
|---|---|---|---|---|---|---|
| | Vl1 | Vl2 | Vh | 168hours | 336hours | 504hours |
| case1 | -11.6V | -11.6V | 6.2V | 0F/10 | 0F/10 | 0F/10 |
| case2 | -9.0V | -10.6V | 6.2V | 0F/10 | 0F/10 | 0F/10 |

DISPLAY APPARATUS OPERATED WITH LOW REFRESH RATE AND METHOD OF DRIVING THE SAME

CROSS-REFERENCE TO RELATED APPLICATION

The present application claims the benefit of Republic of Korea Patent Application No. 10-2023-0012455, filed in Republic of Korea on Jan. 31, 2023, which is hereby incorporated by reference in its entirety.

BACKGROUND

Technical Field

The present disclosure relates to a display device, and more particularly, to a display device where deterioration such as a bending crack is reduced by changing a gate control signal in an anode reset subframe of a low refresh rate and a method of driving the display device.

Discussion of the Related Art

Recently, with the advent of an information-oriented society, the interest in information displays for processing and displaying a massive amount of information and the demand for portable information media have increased. As such, a display field has rapidly advanced. Thus, various light and thin flat panel display devices have been developed and highlighted.

Among the various flat panel display devices, an organic light emitting diode (OLED) display device is an emissive type device that does not include a backlight unit used in a non-emissive type device such as a liquid crystal display (LCD) device. As a result, the OLED display device has advantages in a viewing angle, a contrast ratio and a power consumption to be applied to various fields.

The OLED display device displays an image by changing a frequency (refresh rate) according to a mode. For example, the OLED display device may display an image with about 60 Hz in a real use mode and with about 1 Hz in a standby mode.

When the OLED display device is driven with a relatively low frequency, a gate signal and a data signal are generated and inputted during a refresh subframe of a single frame (1F), and generation and input of a gate signal and a data signal are stopped during an anode reset subframe of a single frame. During the anode reset subframe where the gate signal and the data signal are stopped, a gate control signal inputted to a gate driving unit is maintained as a logic low voltage. As a result, since a signal line transmitting the gate control signal consistently attracts a positive ion, an insulating layer on the signal line is deteriorated to cause a deterioration such as a bending crack. Accordingly, a reliability of the OLED display device is reduced.

SUMMARY

Accordingly, the present disclosure is directed to a display device that substantially obviates one or more of the problems due to limitations and disadvantages of the related art.

An object of the present disclosure is to provide a display device where a deterioration of an insulating layer on a signal line is minimized, a deterioration such as a bending crack is prevented and a reliability is improved due to a gate control signal alternately having a logic high voltage and a logic low voltage during an anode reset subframe where a generation of a gate signal is stopped and a method of driving the display device.

Another object of the present disclosure is to provide a display device where deterioration such as a bending crack is prevented and reliability is improved due to a gate control signal having a logic high voltage period longer than a logic low voltage period during an anode reset subframe and a method of driving the display device.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a timing controlling unit configured to generate an image data, a data control signal and a gate control signal; a data driving unit configured to generate a data signal using the image data and the data control signal; a gate driving unit configured to generate a gate signal using the gate control signal; and a display panel configured to display an image using the data signal and the gate signal, wherein a start signal of the gate control signal has one pulse between a logic high voltage and a logic low voltage during a refresh subframe where the data signal and the gate signal are supplied and has a plurality of pulses between the logic high voltage and the logic low voltage during an anode reset subframe where supply of the data signal and the gate signal is stopped.

In another aspect, a method of driving a display device including a timing controlling unit configured to generate an image data, a data control signal and a gate control signal, a data driving unit configured to generate a data signal using the image data and the data control signal, a gate driving unit configured to generate a gate signal using the gate control signal, and a display panel configured to display an image using the data signal and the gate signal, the method includes: supplying the data signal and the gate signal by the data driving unit and the gate driving unit, respectively, during a refresh subframe; and stopping supply of the data signal and the gate signal by the data driving unit and the gate driving unit, wherein a start signal of the gate control signal has one pulse between a logic high voltage and a logic low voltage during the refresh subframe and has a plurality of pulses between the logic high voltage and the logic low voltage during the anode reset subframe.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 7 is a table showing a test result of a display device according to an embodiment of the present disclosure;

DETAILED DESCRIPTION

Figure 1:
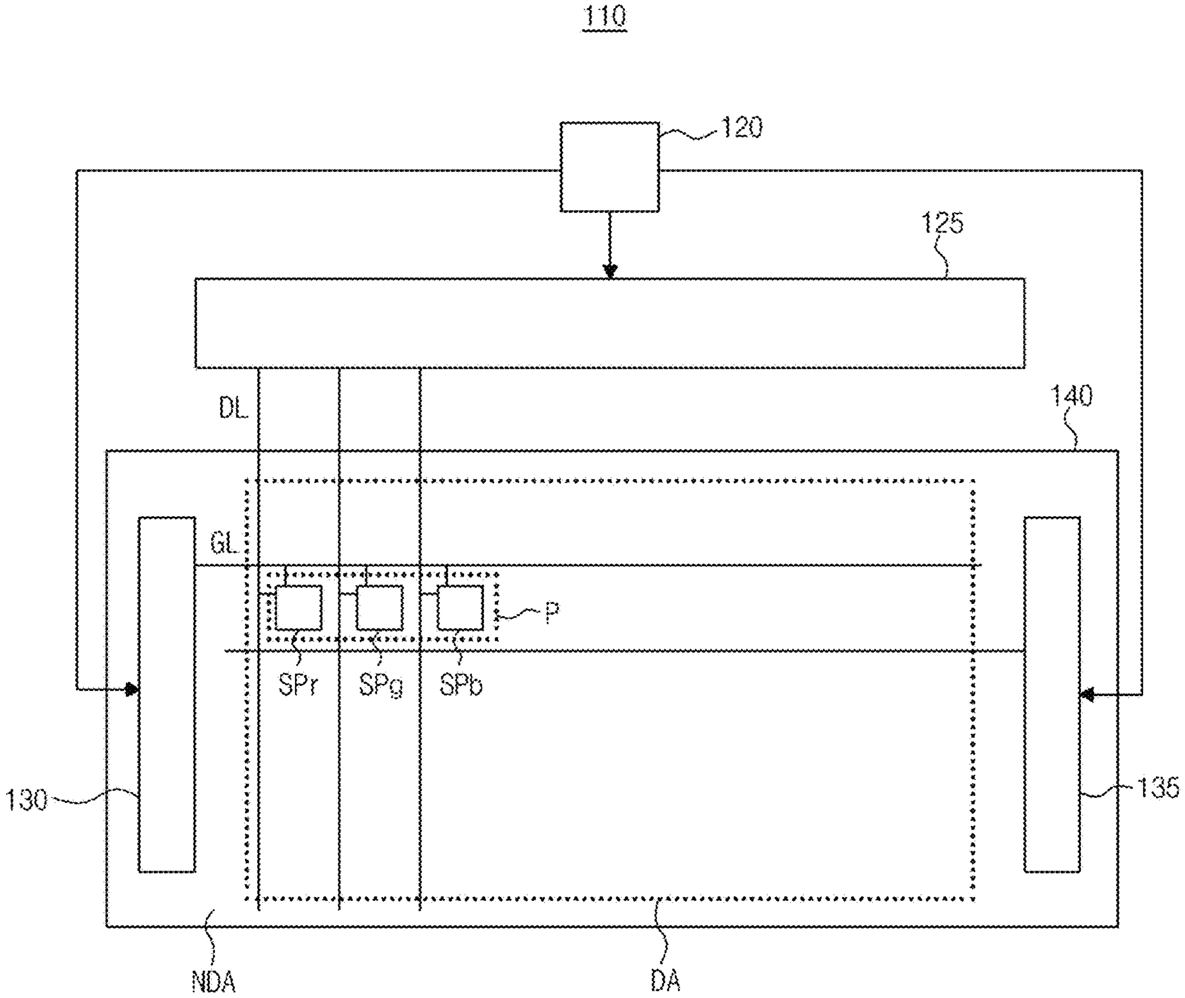
FIG. 1 is a view showing a display device according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout the specification, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or a tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," A, B, (a), (b), and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

The term "at least one" should be understood to include all combinations of one or more of related elements. For example, the term of "at least one of first, second and third elements" may include all combinations of two or more of the first, second and third elements as well as the first, second or third element.

The term "display device" may include a display device in a narrow sense such as liquid crystal module (LCM), an organic light emitting diode (OLED) module and a quantum dot (QD) module including a display panel and a driving unit for driving the display panel. In addition, the term "display device" may include a complete product (or a final product) including the LCM, the OLED module and the QD module such as a notebook computer, a television, a computer monitor, an equipment display device including an automotive display apparatus or a shape other than a vehicle, and a set electronic apparatus or a set device (or a set apparatus) such as a mobile electronic apparatus of a smart phone or an electronic pad.

Accordingly, a display device of the present disclosure may include an applied product or a set device of a final user's device including the LCM, the OLED module and the QD module as well as a display device in a narrow sense such as the LCM, the OLED module and the QD module.

According to circumstances, the LCM, the OLED module and the QD module having a display panel and a driving unit may be expressed as "a display device", and an electronic apparatus of a complete product including the LCM, the OLED module and the QD module may be expressed as "a set device." For example, a display device in a narrow sense may include a display panel of a liquid crystal, an organic light emitting diode and a quantum dot and a source printed circuit board (PCB) of a control unit for driving the display panel, and a set device may further include a set PCB of a set control unit electrically connected to the source PCB for controlling the entire set device.

The display panel of the present disclosure may include all kinds of display panels such as a liquid crystal display panel, an organic light emitting diode display panel, a quantum dot display panel and an electroluminescent display panel. The display panel of the present disclosure is not limited to a specific display panel of a bezel bending having a flexible substrate for an organic light emitting diode display panel and a lower back plate supporter. A shape or a size of the display panel for the display device of the present disclosure is not limited thereto.

For example, when the display panel is an organic light emitting diode display panel, the display panel may include a plurality of gate lines, a plurality of data lines and a subpixel in a crossing region of the plurality of gate lines and the plurality of data lines. The display panel may include an array having a thin film transistor of an element for selectively applying a voltage to each subpixel, an emitting element layer on the array and an encapsulating substrate or an encapsulation part covering the emitting element layer. The encapsulation part may protect the thin film transistor and the emitting element layer from an external impact and may prevent or at least reduce penetration of moisture or oxygen into the emitting element layer. In addition, a layer on the array may include an inorganic light emitting layer, for example, a nano-sized material layer or a quantum dot.

The thin film transistor of the present disclosure may include one of an oxide thin film transistor, an amorphous silicon thin film transistor, a low temperature polycrystalline silicon thin film transistor.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a display device according to various example embodiments of the present disclosure where an influence on an oxide semiconductor layer of a thin film transistor of a driving element part is reduced by shielding a light emitted and transmitted from a subpixel and/or a light inputted from an exterior will be described in detail with reference to the accompanying drawings.

FIG. 1 is a view showing a display device according to an embodiment of the present disclosure. The display device may be an organic light emitting diode (OLED) display device.

In FIG. 1, a display device 110 according to an embodiment of the present disclosure includes a timing controlling unit 120, a data driving unit 125, first and second gate driving units 130 and 135 and a display panel 140.

The timing controlling unit 120 generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 125, and the gate control signal is transmitted to the first and second gate driving units 130 and 135.

For example, the data control signal may include a source start pulse (SSP), a source sampling clock (SSC) and a source output enable (SOE), and the gate control signal may include a gate start pulse (GSP), a gate shift clock (GSC) and a gate output enable (GOE).

The data driving unit 125 generates a data signal (a data voltage) Vdata (of FIG. 3) using the data control signal and the image data transmitted from the timing controlling unit 120 and transmits the data signal to a data line DL of the display panel 140.

The first and second gate driving units 130 and 135 generate gate signals (gate voltages) Sc1, Sc2*o*, Sc2*e*, Sc3 and Sc4 (of FIG. 3) and an emission signal (an emission voltage) Em (of FIG. 3) using the gate control signal transmitted from the timing controlling unit 120 and applies the gate signals Sc1, Sc2*o*, Sc2*e*, Sc3 and Sc4 and the emission signal Em to a gate line GL of the display panel 140.

The first and second gate driving units 130 and 135 may have a gate in panel (GIP) type to be formed in a non-display area NDA of a substrate of the display panel 140 having the gate line GL, the data line DL and a pixel P.

Although the first and second gate driving units 130 and 135 are disposed in both side portions of the display panel 140 in the embodiment of FIG. 1, one gate driving unit may be disposed in one side portion of the display panel 140 in another embodiment.

The display panel 140 includes a display area DA at a central portion thereof and a non-display area NDA surrounding the display area DA. The display panel 140 displays an image using the gate signals Sc1, Sc2*o*, Sc2*e*, Sc3 and Sc4, the emission signal Em and the data signal Vdata. For displaying an image, the display panel 140 includes a plurality of pixels P, a plurality of gate lines GL and a plurality of data lines DL in the display area DA.

Each of the plurality of pixels P includes red, green and blue subpixels SPr, SPg and SPb, and the gate line GL and the data line DL cross each other to define the red, green and blue subpixels SPr, SPg and SPb. Each of the red, green and blue subpixels SPr, SPg and SPb is connected to the gate line GL and the data line DL.

When the display device 110 is an OLED display device, each of the red, green and blue subpixels SPr, SPg and SPb may include a plurality of transistors such as a switching transistor, a driving transistor and a sensing transistor, a storage capacitor and a light emitting diode.

A structure of the display panel 140 and the subpixel SP of the display device 110 will be illustrated with reference to a drawing.

Figure 2:
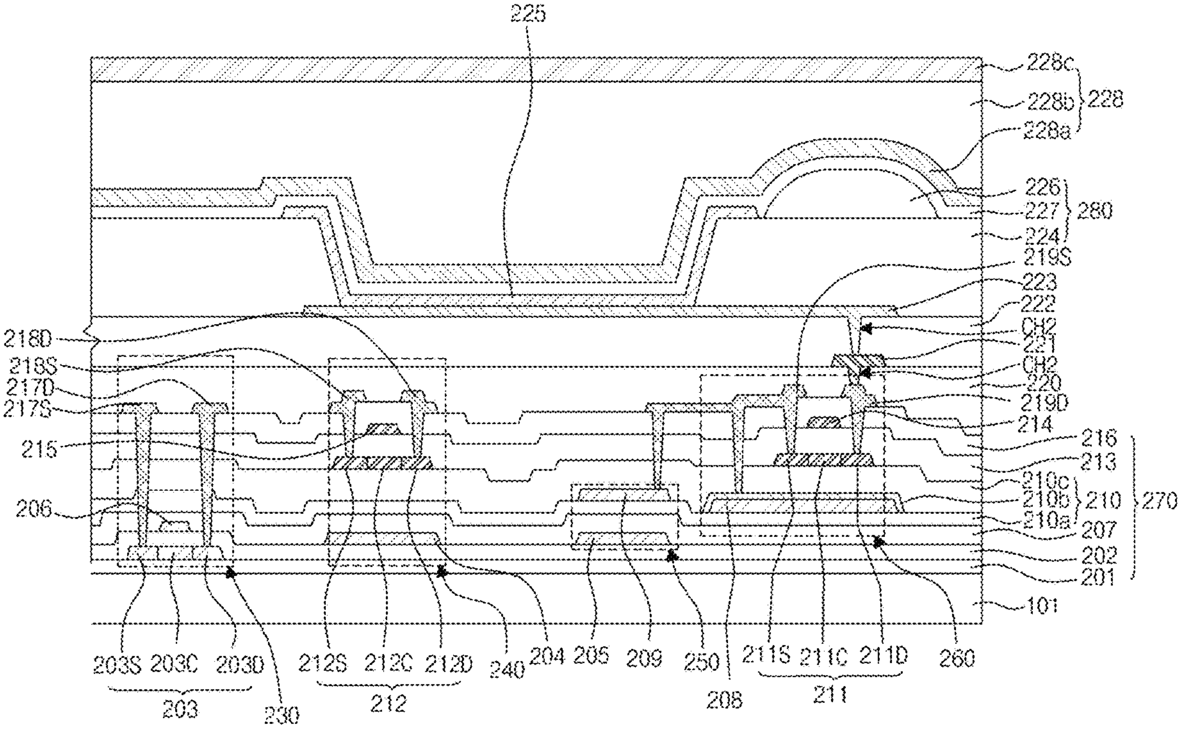
FIG. 2 is a cross-sectional view showing a display panel of a display device according to an embodiment of the present disclosure.
Figure 3:
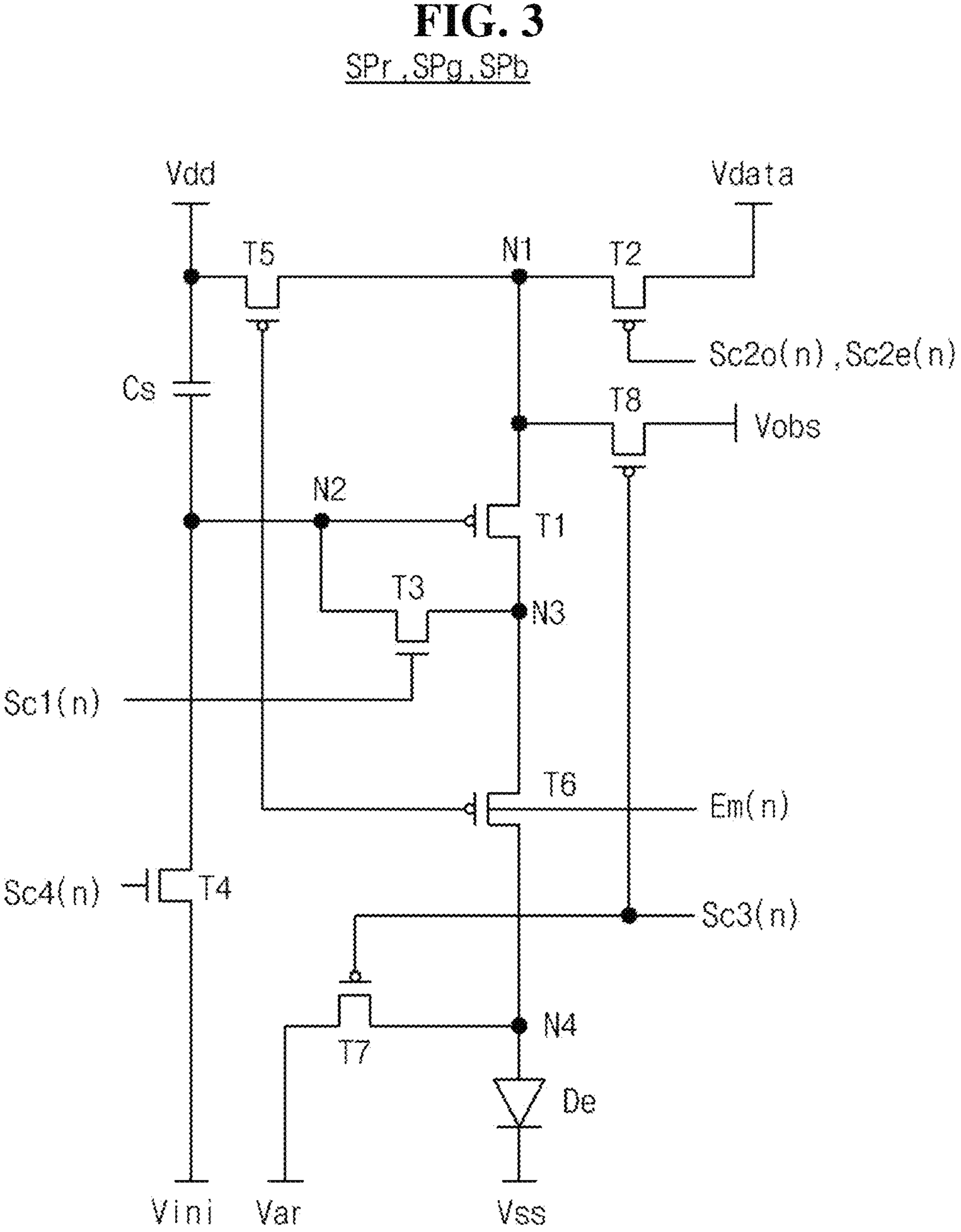
FIG. 3 is a circuit diagram showing a subpixel of a display device according to an embodiment of the present disclosure.

FIG. 2 is a cross-sectional view showing a display panel of a display device according to an embodiment of the present disclosure, and FIG. 3 is a circuit diagram showing a subpixel of a display device according to an embodiment of the present disclosure.

In FIG. 2, the display panel 140 of the display device 110 according to an embodiment of the present disclosure includes one driving transistor 260, two switching transistors 230 and 240, and one storage capacitor 250.

A driving element 270 and an emitting element 280 electrically connected to the driving element 270 are disposed in each of the subpixels SPr, SPg and SPb on a substrate 101. The driving element 270 and the emitting element 280 are insulated from each other by planarizing layers 220 and 222.

The driving element 270 may be an array part including the driving transistor 260, the switching transistors 230 and 240, and the storage capacitor 250 and driving each of the subpixels SPr, SPg and SPb. The emitting element 280 may be an array part for light emission including an anode 223, a cathode 227, and an emitting layer 225 between the anode 223 and the cathode 227. The driving element 270 may be a first array part, and the emitting element 280 may be a second array part.

The driving element of an embodiment of FIG. 2 exemplarily includes one driving transistor 260, two switching transistors 230 and 240 and one storage capacitor 250.

The driving transistor 260 and the at least one switching transistor use an oxide semiconductor layer as an active layer. The oxide semiconductor layer formed of an oxide semiconductor material has an excellent effect of blocking a leakage current and has a relatively low fabrication cost as compared with a polycrystalline silicon layer. For example, the oxide semiconductor layer may include indium gallium zinc oxide (IGZO), zinc oxide (ZnO), tin oxide ($SnO2$), copper oxide ($Cu2O$), nickel oxide (NiO), indium tin zinc oxide (ITZO) and/or indium aluminum zinc oxide (IAZO). The embodiments of the present disclosure are not limited thereto. In the embodiment of the present disclosure, to reduce a power consumption and a fabrication cost, the driving transistor 260 and the at least one switching transistor may be fabricated using an oxide semiconductor layer.

A transistor using a polycrystalline semiconductor layer including a polycrystalline semiconductor material, for example, polycrystalline silicon (poly-Si) has a relatively high operation speed and an excellent reliability. In the embodiment of FIG. 2, one of the switching transistors may include a polycrystalline semiconductor layer and the others of the switching transistors may include an oxide semiconductor layer.

At least one of one driving transistor 260 and two switching transistors 230 and 240 is a positive (P) type transistor and the others of one driving transistor 260 and two switching transistors 230 and 240 are a negative (N) type transistor. For example, the driving transistor 260 may have a P type, and the transistor having an oxide semiconductor layer of two switching transistors 230 and 240 may have a N type.

The substrate 101 may have a multiple layer where at least one organic layer and at least one inorganic layer are alternately laminated. For example, the substrate 101 may have an organic layer including an organic material such as polyimide and an inorganic layer including an inorganic material such as silicon oxide (SiOx) alternately laminated with each other.

A lower buffer layer 201 may be disposed on the substrate 101. The lower buffer layer 201 may block permeation of an external material, for example, a moisture. The lower buffer layer 201 may have a multiple layer of silicon oxide (SiOx). A second buffer layer may be further disposed on the lower buffer layer 201 for protection from a moisture.

A first switching transistor 230 (one of second to eighth transistors T2 to T8 (of FIG. 3)) may be disposed on the lower buffer layer 201. The first switching transistor 230 may use a polycrystalline semiconductor layer as an active layer. The first switching transistor 230 may include a first active layer 203 having a channel where an electron or a hole moves, a first gate electrode 206, a first source electrode 217S and a first drain electrode 217D.

The first active layer 203 may include a polycrystalline semiconductor material. The first active layer 203 may include a first channel region 203C and a first source region 203S and a first drain region 203D at both sides of the first channel region 203C.

The first source region 203S and the first drain region 203D may include a conductorized region by doping an intrinsic polycrystalline semiconductor pattern with an impurity of a V group or a III group, for example, phosphorus (P) or boron (B). The first channel region 203C where the polycrystalline semiconductor material is kept as an intrinsic state may provide a moving path for an electron or a hole.

The first switching transistor 230 may include a first gate electrode 206 overlapping the first channel region 203C of the first active layer 203. A first gate insulating layer 202 may be disposed between the first gate electrode 206 and the first active layer 203.

The first switching transistor 230 may have a top gate type where the first gate electrode 206 is disposed over the first active layer 203. A first capacitor electrode 205 of the storage capacitor 250 and a second light shielding layer 204 of the second switching transistor 240 may be formed of a same material as the first gate electrode 206 through one mask process. As a result, a number of the mask processes may be reduced.

The first gate electrode 206 may include a metallic material. For example, the first gate electrode 206 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

A first interlayer insulating layer 207 may be disposed on the first gate electrode 206. The first interlayer insulating layer 207 may include silicon nitride (SiNx). The first interlayer insulating layer 207 of silicon nitride (SiNx) may have a hydrogen particle. When a heat treatment process is performed after the first active layer 203 is formed and the first interlayer insulating layer 207 is formed on the first active layer 203, the hydrogen particle of the first interlayer insulating layer 207 penetrates into the first source region 203S and the first drain region 203D to improve and stabilize a conductivity of the polycrystalline semiconductor material. The above process may be referred to as a hydrogenation process.

The first switching transistor 230 may further include an upper buffer layer 210, a second gate insulating layer 213 and a second interlayer insulating layer 216 sequentially on the first interlayer insulating layer 207. The first switching transistor 230 may be disposed on the second interlayer insulating layer 216 and may include a first source electrode 217S and a first drain electrode 217D connected to the first source region 203S and the first drain region 203D, respectively.

The upper buffer layer 210 may separate the first active layer 203 including a polycrystalline semiconductor material, the second active layer 212 of the second switching transistor 240 including an oxide semiconductor material and the third active layer 211 of the driving transistor 260 including an oxide semiconductor material. The upper buffer layer 210 may provide a base for the second active layer 212 and the third active layer 211.

A second interlayer insulating layer 216 may be disposed on the second gate electrode 215 of the second switching transistor 240 and the third gate electrode 214 of the driving transistor 260. Since the second interlayer insulating layer 216 is disposed on the second active layer 212 and the third active layer 211 including an oxide semiconductor material, the second interlayer insulating layer 216 may include an inorganic material without a hydrogen particle.

The first source electrode 217S and the first drain electrode 217D may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The second switching transistor 240 (another of the second to eighth transistors T2 to T8 (of FIG. 3)) may be disposed on the upper buffer layer 210 and may include the second active layer 212 including an oxide semiconductor material, the second gate insulating layer 213 covering the second active layer 212, the second gate electrode 215 on the second gate insulating layer 213, the second interlayer insulating layer 216 covering the second gate electrode 215, and the second source electrode 218S and the second drain electrode 218D on the second interlayer insulating layer 216.

The second switching transistor 240 may further include a second light shielding layer 204 disposed under the upper buffer layer 210 and overlapping the second active layer 212. The second light shielding layer 204 may include the same material as the first gate electrode 206 and may be disposed on the first gate insulating layer 202.

The second light shielding layer 204 may be electrically connected to the second gate electrode 215 to constitute a dual gate. When the second switching transistor 240 has a dual gate structure, a current flow through a second channel region 212C may be more accurately controlled. Further, since a display device is formed to have a smaller size, a display device of a relatively high resolution may be obtained.

The second active layer 212 may include an oxide semiconductor material and may have a second channel region 212C, a second source region 212S and a second drain region 212D. The second channel region 212C may have an intrinsic state not doped with an impurity, and the second source region 212S and the second drain region 212D may have a conductorization state doped with an impurity.

The second source electrode 218S and the second drain electrode 218D may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The second source electrode 218S, the second drain electrode 218D, the first source electrode 217S and the first drain electrode 217D may be simultaneously formed on the second interlayer insulating layer 216 with the same material. As a result, a number of the mask processes may be reduced.

The driving transistor 260 (a first transistor T1 (of FIG. 3)) may be disposed on the upper buffer layer 210.

The driving transistor 260 may include a third active layer 211 including an oxide semiconductor material on the upper buffer layer 210, a second gate insulating layer 213 covering the third active layer 211, a third gate electrode 214 disposed on the second gate insulating layer 213 and overlapping the third active layer 211, the second interlayer insulating layer 216 covering the third gate electrode 214 and a third source electrode 219S and a third drain electrode 219D on the second interlayer insulating layer 216.

The driving transistor 260 may further include a first light shielding layer 208 disposed in the upper buffer layer 210 and overlapping the third active layer 211. The first light shielding layer 208 may be formed to be inserted (or accommodated) into the upper buffer layer 210.

For a structure where the first light shielding layer 208 is disposed in the upper buffer layer 210, the first light shielding layer 208 may be disposed on a first upper sub-buffer layer 210*a* over the first interlayer insulating layer 207. A second upper sub-buffer layer 210*b* may be disposed on the first light shielding layer 208 to cover the first light shielding layer 208 completely, and a third upper sub-buffer layer 210*c* may be disposed on the second upper sub-buffer layer 210*b*. For example, the upper buffer layer 210 may have a structure where the first upper sub-buffer layer 210*a*, the second upper sub-buffer layer 210*b* and the third upper sub-buffer layer 210*c* are sequentially laminated.

The first upper sub-buffer layer 210*a* and the third upper sub-buffer layer 210*c* may include silicon oxide (SiOx). When the first upper sub-buffer layer 210*a* and the third upper sub-buffer layer 210*c* include silicon oxide (SiOx) without a hydrogen particle, the first upper sub-buffer layer 210*a* and the third upper sub-buffer layer 210*c* may be provided as a base for the second switching transistor 240 and the driving transistor 260 using an oxide semiconductor material susceptible to a hydrogen particle for an active layer.

The second upper sub-buffer layer 210*b* may include silicon nitride (SiNx) having an excellent capturing ability for a hydrogen particle. The second upper sub-buffer layer 210*b* may surround a top surface and a side surface of the first light shielding layer 208 to seal the first light shielding layer 208 completely.

A hydrogen particle generated in a hydrogenation process of the first switching transistor 230 using a polycrystalline semiconductor material for an active layer may pass through the upper buffer layer 210 to deteriorate a reliability of an oxide semiconductor material on the upper buffer layer 210. For example, when a hydrogen particle penetrates into an oxide semiconductor material, a transistor including an oxide semiconductor material may have different threshold voltages or may have different conductivities of a channel according to a position where the oxide semiconductor material is disposed.

Since silicon nitride (SiNx) has an excellent capturing ability for a hydrogen particle as compared with silicon oxide (SiOx), deterioration of a reliability of the driving transistor 260 due to a hydrogen particle penetrating into an oxide semiconductor material may be prevented.

The first light shielding layer 208 may include a metallic material such as titanium (Ti) having an excellent capturing ability for a hydrogen particle. For example, the first light shielding layer 208 may have a single layer of titanium (Ti), a multiple layer of molybdenum (Mo) and titanium (Ti) or a single layer of an alloy of molybdenum (Mo) and titanium (Ti). In another embodiment, the first light shielding layer 208 may include another metallic material including titanium (Ti).

Titanium (Ti) may capture a hydrogen particle diffused in the upper buffer layer 210 to prevent a hydrogen particle from reaching the third active layer 211. When the first light shielding layer 208 of the driving transistor 260 is formed of a metallic material such as titanium (Ti) having a capturing ability for a hydrogen particle and is surrounded by silicon nitride (SiNx) having a capturing ability for a hydrogen particle, a reliability of a pattern of an oxide semiconductor material against a hydrogen particle is obtained.

Differently from the first upper sub-buffer layer 210*a*, the second upper sub-buffer layer 210*b* including silicon nitride (SiNx) is not disposed in the entire display area. Instead, the second upper sub-buffer layer 210*b* may be disposed on a portion of the first upper sub-buffer layer 210*a* to selectively cover the first light shielding layer 208. The second upper sub-buffer layer 210*b* may include a material such as silicon nitride (SiNx) different from a material of the first upper sub-buffer layer 210*a*. As a result, when the second upper sub-buffer layer 210*b* is disposed in the entire display area, the second upper sub-buffer layer 210*b* may be peeled off. To prevent the peeling, the second upper sub-buffer layer 210*b* may be selectively disposed on a portion where the first light shielding layer 208 is disposed.

The first light shielding layer 208 and the second upper sub-buffer layer 210*b* may be disposed directly under the third active layer 211 to overlap the third active layer 211. The first light shielding layer 208 and the second upper sub-buffer layer 210*b* may have a size greater than a size of the third active layer 211 to completely overlap the third active layer 211.

The third source electrode 219S of the driving transistor 260 may be electrically connected to the first light shielding layer 208.

The storage capacitor 250 (Cs (of FIG. 3)) may store the data signal applied through the data line and may provide the data signal to the emitting element. The storage capacitor 250 may include two corresponding electrodes and a dielectric layer between the two electrodes. For example, the storage capacitor 250 may include a first capacitor electrode 205 having the same material and the same layer as the first gate electrode 206 and a second capacitor electrode 209 having the same material and the same layer as the first light shielding layer 208. The first interlayer insulating layer 207 and the first upper sub-buffer layer 210*a* may be disposed between the first capacitor electrode 205 and the second capacitor electrode 209. The second capacitor electrode 209 of the storage capacitor 250 may be electrically connected to the third source electrode 219S.

In an embodiment of FIG. 2, the storage capacitor 250 may be disposed at a side of the driving transistor 260. In another embodiment, the storage capacitor 250 may be disposed to be laminated with the driving transistor 260. When the storage capacitor 250 is laminated with the driving transistor 260, at least portion of the third source electrode 219S connected to the second capacitor electrode 209 may be omitted. For example, a fourth gate electrode may be further disposed on the third gate electrode 214 of the driving transistor 260. The third gate electrode 214 and the fourth gate electrode may be spaced apart from each other to constitute the storage capacitor 250.

A first planarizing layer 220 and a second planarizing layer 222 may be disposed on the driving element 270 to planarize the driving element 270. The first planarizing layer 220 and the second planarizing layer 222 may include an organic material such as polyimide and acrylic resin.

The emitting element 280 (De (of FIG. 3)) is disposed on the second planarizing layer 222. The emitting element 280 includes a first electrode 223 as an anode, a second electrode 227 as a cathode corresponding to the first electrode 223 and an emitting layer 225 between the first electrode 223 and the second electrode 227. The first electrode 223 may be disposed in each subpixel.

The emitting element 280 may be connected to the driving element 270 through a connecting electrode 221 on the first planarizing layer 220. For example, the first electrode 223 of the emitting element 280 and the third drain electrode 219D of the driving transistor 260 of the driving element 270 may be connected to each other through the connecting electrode 221.

The first electrode 223 may contact the connecting electrode 221 exposed through a first contact hole CH1 in the second planarizing layer 222. The connecting electrode 221 may contact the third drain electrode 219D exposed through a second contact hole CH2 in the first planarizing layer 220.

The first electrode 223 may have a multiple layer including a transparent conductive material and an opaque conductive material having a relatively high reflectance. For example, the first electrode 223 may have a single layer or a multiple layer including a transparent conductive material having a relatively high work function such as indium tin oxide (ITO) or indium zinc oxide (IZO) and an opaque conductive material such as aluminum (Al), silver (Ag), copper (Cu), lead (Pb), molybdenum (Mo), titanium (Ti) and an alloy thereof. For example, the first electrode 223 may have a structure where a transparent conductive layer, an opaque conductive layer and a transparent conductive layer are sequentially laminated or a structure where a transparent conductive layer and an opaque conductive layer are sequentially laminated.

The emitting layer 225 may include a hole assisting layer, an emitting material layer and an electron assisting layer sequentially on the first electrode 223 or an electron assisting layer, an emitting material layer and a hole assisting layer sequentially on the first electrode 223. A bank layer 224 may expose the first electrode 223 of each subpixel and may be referred to as a pixel defining layer. The bank layer 224 may include an opaque material, for example, a black organic material to prevent an optical interference between the adjacent subpixels. For example, the bank layer 224 may include a light shielding material of at least one of a color pigment, an organic black and a carbon. A spacer 226 may be disposed on the bank layer 224.

The second electrode 227 of a cathode is disposed on a top surface and a side surface of the emitting layer 225 to face the first electrode 223 with the emitting layer 225 interposed therebetween. The second electrode 227 may be disposed in the entire display area as one body. When the organic light emitting diode display device has a top emission type, the second electrode 227 may include a transparent conductive material such as indium tin oxide (ITO) or indium zinc oxide (IZO).

An encapsulating element 228 for preventing permeation of a moisture may be further disposed on the second electrode 227. The encapsulating element 228 may include a first inorganic encapsulating layer 228*a*, a second organic encapsulating layer 228*b*, and a third inorganic encapsulating layer 228*c* sequentially laminated.

The first inorganic encapsulating layer 228*a* and the third inorganic encapsulating layer 228*c* of the encapsulating element 228 may include an inorganic material such as silicon oxide (SiOx). The second organic encapsulating layer 228*b* of the encapsulating element 228 may include an organic material such as acrylic resin, epoxy resin, phenolic resin, polyamide resin and polyimide resin.

Although not shown, a touch panel including a plurality of touch electrodes may be disposed on the encapsulating element 228. The touch panel may be attached to the display panel 140 as an individual element, or may be formed together with the display panel 140 as an in-cell type or an on-cell type.

In FIG. 3, each of the red, green and blue subpixels SPr, SPg and SPb of the display panel 140 of the display device 110 according to an embodiment of the present disclosure includes first to eighth transistors T1 to T8, a storage capacitor Cs and a light emitting diode De. At least one of the first to eighth transistors T1 to T8 may be an oxide semiconductor thin film transistor, and the others of the first to eighth transistors T1 to T8 may be low temperature polycrystalline silicon thin film transistor.

For example, the first, second, fifth, sixth, seventh and eighth transistors T1, T2, T5, T6, T7 and T8 may be a positive (P) type low temperature polycrystalline silicon thin film transistor, and the third and fourth transistors T3 and T4 may be a negative (N) type oxide semiconductor thin film transistor.

Alternatively, the second, fifth, sixth, seventh and eighth transistors T2, T5, T6, T7 and T8 may be a low temperature polycrystalline silicon thin film transistor, and the first, third and fourth transistors T1, T3 and T4 may be an oxide semiconductor thin film transistor.

The first transistor T1 of a driving transistor is switched according to a voltage of the first capacitor electrode of the storage capacitor Cs. A gate electrode of the first transistor T1 is connected to the first capacitor electrode of the storage capacitor Cs, a drain electrode of the third transistor T3 and a drain electrode of the fourth transistor T4, a source electrode of the first transistor T1 is connected to a source electrode of the second transistor T2, a drain electrode of the fifth transistor T5 and a source electrode of the eighth transistor T8, and a drain electrode of the first transistor T1 is connected to a source electrode of the third transistor T3 and a source electrode of the sixth transistor T6.

The second transistor T2 of a switching transistor is switched according to an nth odd gate2 signal Sc2*o*(*n*) or an nth even gate2 signal Sc2*e*(*n*). A gate electrode of the second transistor T2 is connected to the nth odd gate2 signal Sc2*o*(*n*) or the nth even gate2 signal Sc2*e*(*n*), a source electrode of the second transistor T2 is connected to a source electrode of the first transistor T1, a drain electrode of the fifth transistor T5 and a source electrode of the eighth transistor T8, and a drain electrode of the second transistor T2 is connected to the data signal Vdata.

The third transistor T3 of a sensing transistor is switched according to an nth gate1 signal Sc1(*n*). A gate electrode of the third transistor T3 is connected to the nth gate1 signal Sc1(*n*), a source electrode of the third transistor T3 is connected to a drain electrode of the first transistor T1 and a source electrode of the sixth transistor T6, and a drain electrode of the third transistor T3 is connected to a gate electrode of the first transistor T1, a first capacitor electrode of the storage capacitor Cs and a drain electrode of the fourth transistor T4.

The fourth transistor T4 is switched according to an nth gate4 signal Sc4(*n*). A gate electrode of the fourth transistor T4 is connected to the nth gate4 signal Sc4(*n*), a source electrode of the fourth transistor T4 is connected to an initial voltage Vini, and a drain electrode of the fourth transistor T4 is connected to a gate electrode of the first transistor T1, a first capacitor electrode of the storage capacitor Cs and a drain electrode of the third transistor T3.

The fifth transistor T5 of an emission transistor is switched according to an nth emission signal Em(n). A gate electrode of the fifth transistor T5 is connected to the nth emission signal Em(n), a source electrode of the fifth transistor T5 is connected to a high-level voltage Vdd and the second capacitor electrode of the storage capacitor Cs, and a drain electrode of the fifth transistor T5 is connected to a source electrode of the first transistor T1, a source electrode of the second transistor T2 and a source electrode of the eighth transistor T8.

The sixth transistor T6 of an emission transistor is switched according to an nth emission signal Em(n). A gate electrode of the sixth transistor T6 is connected to the nth emission signal Em(n), a source electrode of the sixth transistor T6 is connected to a drain electrode of the first transistor T1 and a source electrode of the third transistor T3, and a drain electrode of the sixth transistor T6 is connected to an anode of the light emitting diode De and a source electrode of the seventh transistor T7.

The seventh transistor T7 is switched according to an nth gate3 signal Sc3(*n*). A gate electrode of the seventh transistor T7 is connected to the nth gate3 signal Sc3(*n*), a source electrode of the seventh transistor T7 is connected to a drain electrode of the sixth transistor T6 and an anode of the light emitting diode De, and a drain electrode of the seventh transistor T7 is connected to an anode reset voltage Var.

The eighth transistor T8 is switched according to an nth gate3 signal Sc3(*n*). A gate electrode of the eighth transistor T8 is connected to the nth gate3 signal Sc3(*n*), a source electrode of the eighth transistor T8 is connected to a source electrode of the first transistor T1, a source electrode of the second transistor T2 and a drain electrode of the fifth transistor T5, and a drain electrode of the eighth transistor T8 is connected to a stress voltage Vobs.

The storage capacitor Cs stores the data signal Vdata and the threshold voltage Vth. A first capacitor electrode of the storage capacitor Cs is connected to the gate electrode of the first transistor T1 and the drain electrode of the fourth transistor T4, and a second capacitor electrode of the storage capacitor Cs is connected to the high-level voltage Vdd and the source electrode of the fifth transistor T5.

The light emitting diode De is connected between the sixth and seventh transistors T6 and T7 and the low-level voltage Vss to emit a light of a luminance proportional to a current of the first transistor T1. An anode of the light emitting diode De is connected to the drain electrode of the sixth transistor T6 and the source electrode of the seventh transistor T7, and a cathode of the light emitting diode De is connected to the low-level voltage Vss.

The source electrode of the first transistor T1, the source electrode of the second transistor T2, the drain electrode of the fifth transistor T5 and the source electrode of the eighth transistor T8 constitute a first node N1, and the gate electrode of the first transistor T1, the drain electrode of the third transistor T3, the first capacitor electrode of the storage capacitor Cs and the drain electrode of the fourth transistor T4 constitute a second node N2. The source electrode of the first transistor T1, the drain electrode of the third transistor T3 and the source electrode of the sixth transistor T6 constitute a third node N3, and the drain electrode of the sixth transistor T6, the source electrode of the seventh transistor T7 and the anode of the light emitting diode De constitute a fourth node N4.

In the display device 110, the timing controlling unit 120 transmits the gate control signal to the first and second gate driving units 130 and 135 through a plurality of signal lines, and the first and second gate driving units 130 and 135 generate the gate signals Sc1, Sc2*o*, Sc2*e*, Sc3 and Sc4 using the gate control signal.

Figure 4:
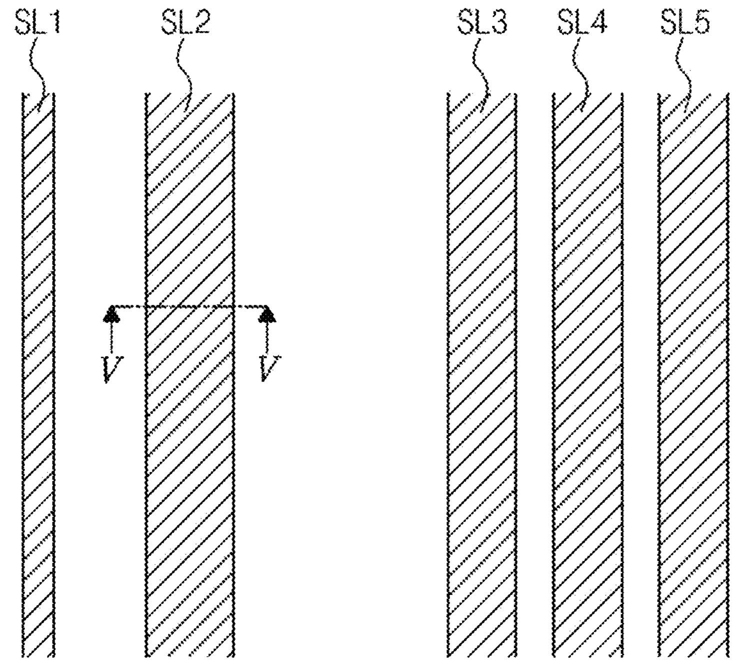
FIG. 4 is a plan view showing a plurality of signal lines of a display device according to an embodiment of the present disclosure.
Figure 5:
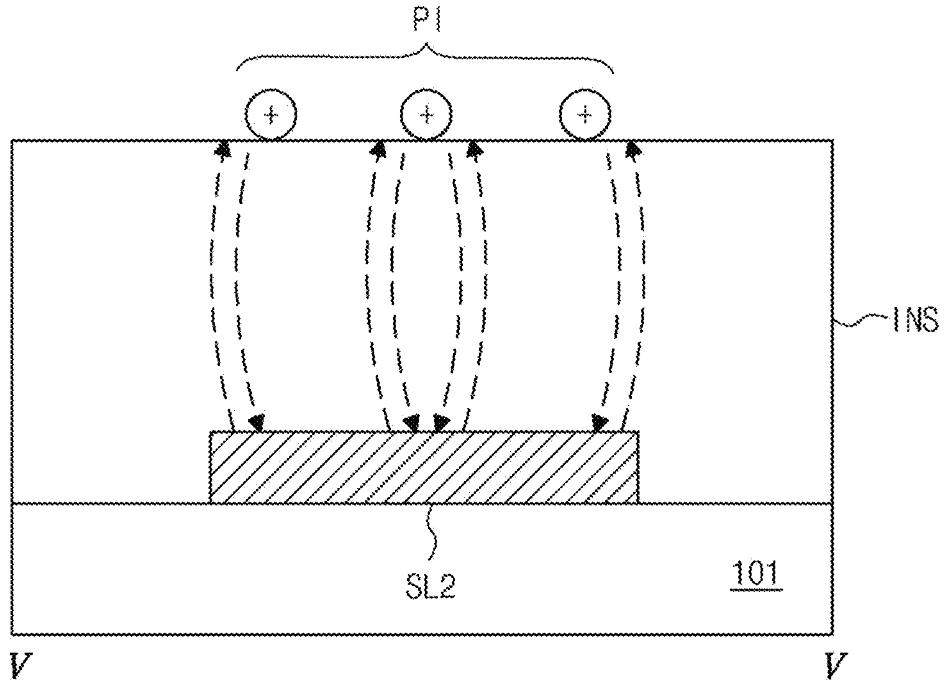
FIG. 5 is a cross-sectional view taken along a line V-V of FIG. 4, according to an embodiment of the present disclosure.

FIG. 4 is a plan view showing a plurality of signal lines of a display device according to an embodiment of the present disclosure, and FIG. 5 is a cross-sectional view taken along a line V-V of FIG. 4, according to an embodiment of the present disclosure.

In FIGS. 4 and 5, first to fifth signal lines SL1 to SL5 parallel to and spaced apart from each other are disposed in the non-display area NDA on the substrate 101 of the display panel 140 of the display device 110 according to an embodiment of the present disclosure. An insulating layer INS is disposed on the first to fifth signal lines SL1 to SL5.

The first to fifth signal lines SL1 to SL5 are connected between the timing controlling unit 120 and the first and second gate driving units 130 and 135 and transmit the gate control signal. The first to fifth signal lines SL1 to SL5 may have the same layer and the same material as one of the first gate electrode 206, the first light shielding layer 208, the second gate electrode 215, the first source electrode 217S and the first drain electrode 217D.

For example, the first signal line SL1 may transmit a panel crack detecting (PCD) signal. The second signal line SL2 may transmit a gate1 start signal Sc1-Vst (of FIG. 6B) used for generating the gate1 signal Sc1, and the third signal line SL3 may transmit a gate3 start signal used for generating the gate3 signal Sc3. The fourth signal line SL4 may transmit an even gate2 start signal used for generating the even gate2 signal Sc2*e*, and the fifth signal line SL5 may transmit an odd gate2 start signal used for generating the odd gate2 signal Sc2*o*.

The insulating layer INS electrically insulates the first to fifth signal lines SL1 to SL5 from other elements.

For example, the insulating layer INS may include at least one of the first and second planarizing layers 220 and 222, the bank layer 224 and the spacer 226 and may be formed of an organic insulating material.

The insulating layer INS are patterned through a photolithographic process having coating, exposure, developing and etching steps, and a positive ion PI in a developing solution may remain on the insulating layer INS after the insulating layer INS is formed.

For example, the positive ion PI may include tetramethylammonium hydroxide.

As a result, when the gate control signal transmitted through the first to fifth signal lines SL1 to SL5 has a negative voltage, a repulsive force is applied to the positive ion PI and the positive ion PI is repelled from the first to fifth signal lines SL1 to SL5.

When the gate control signal transmitted through the first to fifth signal lines SL1 to SL5 has a positive voltage, an attractive force is applied to the positive ion PI and the positive ion PI is attracted to the first to fifth signal lines SL1 to SL5. As a result, the positive ion PI penetrates the insulating layer INS to deteriorate the insulating layer INS.

In the display device 110 according to an embodiment of the present disclosure, the gate control signal alternately has the positive and negative voltages to attract or repel the positive ion PI during an anode reset subframe where generation of the gate signal is stopped.

Figure 6A:
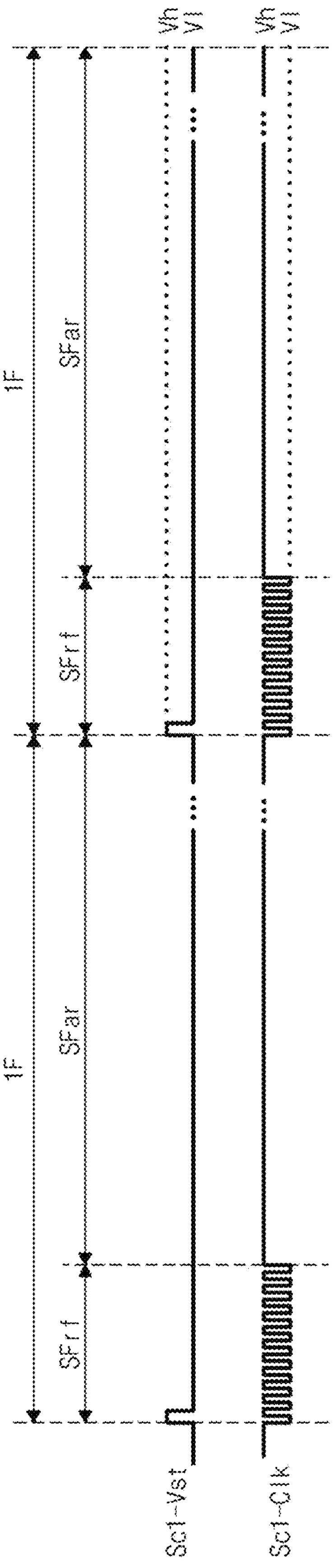
FIG. 6A is a view showing a gate control signal of a display device according to a comparison example.
Figure 6B:
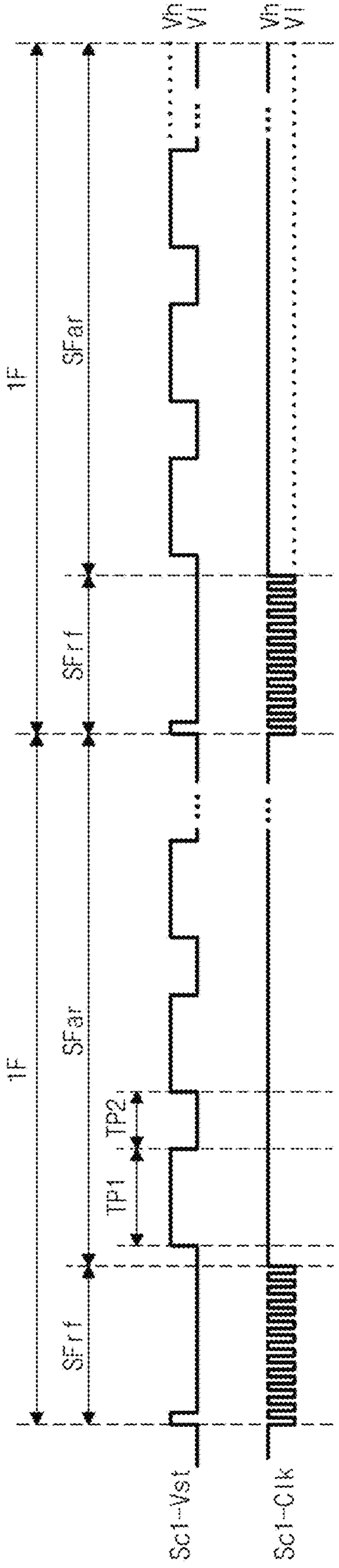
FIG. 6B is a view showing a gate control signal of a display device according to an embodiment of the present disclosure.

FIG. 6A is a view showing a gate control signal of a display device according to a comparison example, and FIG. 6B is a view showing a gate control signal of a display device according to an embodiment of the present disclosure.

In FIGS. 6A and 6B, one frame 1F of the display device according to a comparison example and the display device 110 according to an embodiment of the present disclosure includes a refresh subframe SFrf where the data signal Vdata is inputted and the first to fourth nodes N1 to N4 are reset and an anode reset subframe SFar where the data signal Vdata of the refresh subframe SFrf is maintained without an input of a new data signal Vdata and the first, third and fourth nodes N1, N3 and N4 are reset.

For example, when one frame 1F is classified into $1^{st}$ to $120^{th}$ subframes, the $1^{st}$ subframe may be assigned to the refresh subframe SFrf and the $2^{nd}$ to $120^{th}$ subframes may be assigned to the anode reset subframe SFar in the display device driven with a frequency of about 1 Hz. The $1^{st}$, $13^{th}$, . . . , $109^{th}$ subframes may be assigned to the refresh subframe SFrf and the $2^{nd}$ to $12^{th}$, the $14^{th}$ to $25^{th}$, . . . , the $110^{th}$ to $120^{th}$ subframes may be assigned to the anode reset subframe SFar in the display device driven with a frequency of about 10 Hz. The $1^{st}$, $7^{th}$, $13^{th}$, . . . , $115^{th}$ subframes may be assigned to the refresh subframe SFrf and the $2^{nd}$ to $6^{th}$, the $8^{th}$ to $12^{th}$, . . . , the $116^{th}$ to $120^{th}$ subframes may be assigned to the anode reset subframe SFar in the display device driven with a frequency of about 20 Hz.

In FIG. 6A, when the display device according to a comparison example is driven with a frequency of about 1 Hz, during the refresh subframe SFrf of one frame 1F, the timing controlling unit 120 supplies the gate control signal including a gate1 start signal Sc1-Vst having one pulse between a logic high voltage Vh and a logic low voltage Vl and a gate1 clock Sc1-Clk having a plurality of pulses between the logic high voltage Vh and the logic low voltage Vl and used for generating the gate1 signal Sc1 to the first and second gate driving units 130 and 135. The first and second gate driving units 130 and 135 generate the gate1 signal Sc1, the odd gate2 signal Sc2*o*, the even gate2 signal Sc2*e*, the gate3 signal Sc3 and the gate4 signal Sc4 using the gate control signal including the gate1 start signal Sc1-Vst and the gate1 clock Sc1-Clk and transmits the gate1 signal Sc1, the odd gate2 signal Sc2*o*, the even gate2 signal Sc2*e*, the gate3 signal Sc3 and the gate4 signal Sc4 to each subpixel SPr, SPg and SPb of the display panel 140. Each subpixel SPr, SPg and SPb of the display panel 140 emits a light of a luminance corresponding to the data signal Vdata using the gate1 signal Sc1, the odd gate2 signal Sc2*o*, the even gate2 signal Sc2*e*, the gate3 signal Sc3, the gate4 signal Sc4 and the data signal Vdata.

Here, the logic high voltage Vh may be a positive voltage of about 5.5V to about 6.5V, and the logic low voltage Vl may be a negative voltage of about −12.0V to about −8.5V.

During the anode reset subframe SFar of one frame 1F, the timing controlling unit 120 supplies the gate control signal including the gate1 start signal Sc1-Vst of the logic low voltage Vl and the gate1 clock Sc1-Clk having the logic high voltage Vh to the first and second gate driving units 130 and 135 (i.e., supply of the gate control signal including the gate1 start signal Sc1-Vst and the gate1 clock Sc1-Clk is stopped). The first and second gate driving units 130 and 135 stop generation and supply of the gate1 signal Sc1, the odd gate2 signal Sc2*o*, the even gate2 signal Sc2*e*, the gate3 signal Sc3 and the gate4 signal Sc4, and each subpixel SPr, SPg and SPb of the display panel 140 emits a light of a luminance corresponding to the data signal Vdata of the refresh subframe SFrf.

During the anode reset subframe SFar of one frame 1F, since the gate1 start signal Sc1-Vst of the logic low voltage Vl of a negative voltage is consistently applied to the second signal line SL2, an attractive force is applied to the positive ion PI on the insulating layer INS over the second signal line SL2 and the positive ion PI is attracted to the second signal line SL2 (pull).

As a result, the positive ion PI penetrates the insulating layer INS to deteriorate the insulating layer INS, and deterioration such as a bending crack such that the insulating layer INS and the second signal line SL2 are damaged when the display panel 140 is bent may occur.

In FIG. 6B, when the display device 110 according to an embodiment of the present disclosure is driven with a frequency of about 1 Hz, during the refresh subframe SFrf of one frame 1F, the timing controlling unit 120 supplies the gate control signal including a gate1 start signal Sc1-Vst having one pulse between a logic high voltage Vh and a logic low voltage Vl and a gate1 clock Sc1-Clk having a plurality of pulses between the logic high voltage Vh and the logic low voltage Vl to the first and second gate driving units 130 and 135. The first and second gate driving units 130 and 135 generate the gate1 signal Sc1, the odd gate2 signal Sc2*o*, the even gate2 signal Sc2*e*, the gate3 signal Sc3 and the gate4 signal Sc4 using the gate control signal including the gate1 start signal Sc1-Vst and the gate1 clock Sc1-Clk and transmits the gate1 signal Sc1, the odd gate2 signal Sc2*o*, the even gate2 signal Sc2*e*, the gate3 signal Sc3 and the gate4 signal Sc4 to each subpixel SPr, SPg and SPb of the display panel 140. Each subpixel SPr, SPg and SPb of the display panel 140 emits a light of a luminance corresponding to the data signal Vdata using the gate1 signal Sc1, the odd gate2 signal Sc2*o*, the even gate2 signal Sc2*e*, the gate3 signal Sc3, the gate4 signal Sc4 and the data signal Vdata.

Here, the logic high voltage Vh may be a positive voltage of about 5.5V to about 6.5V, and the logic low voltage Vl may be a negative voltage of about −12.0V to about −8.5V.

During the anode reset subframe SFar of one frame 1F, the timing controlling unit 120 supplies the gate control signal including the gate1 start signal Sc1-Vst having a plurality of pulses between the logic high voltage Vh and the logic low voltage Vl and the gate1 clock Sc1-Clk having the logic high voltage Vh to the first and second gate driving units 130 and 135 (i.e., supply of the gate control signal including the gate1 clock Sc1-Clk is stopped). The first and second gate driving units 130 and 135 stop generation and supply of the gate1 signal Sc1, the odd gate2 signal Sc2*o*, the even gate2 signal Sc2*e*, the gate3 signal Sc3 and the gate4 signal Sc4, and each subpixel SPr, SPg and SPb of the display panel 140 emits a light of a luminance corresponding to the data signal Vdata of the refresh subframe SFrf.

For example, the gate1 start signal Sc1-Vst may have the logic high voltage Vh during a first period TP1 of the anode reset subframe SFar and may have the logic low voltage Vl during a second period TP2 of the anode reset subframe SFar. A width of the first period TP1 may be equal to or greater than a width of the second period TP2.

During the anode reset subframe SFar of one frame 1F, since the gate1 start signal Sc1-Vst alternately having the logic high voltage Vh of a positive voltage and the logic low voltage Vl of a negative voltage is applied to the second signal line SL2, a repulsive force and an attractive force are alternately applied to the positive ion PI on the insulating layer INS over the second signal line SL2, and the positive ion PI is repelled from the second signal line SL2 (push) or is attracted to the second signal line SL2 (pull).

Since a width of the first period TP1 is equal to or greater than a width of the second period TP2, the positive ion PI is repelled from the second signal line SL2 or remains on the insulating layer INS on average. As a result, deterioration of the insulating layer INS due to the positive ion PI is reduced or minimized, and deterioration such as a bending crack such that the insulating layer INS and the second signal line SL2 are damaged when the display panel 140 is bent is reduced or minimized.

Specifically, since a width of the first period TP1 where the gate1 start signal Sc1-Vst has the logic high voltage Vh of a positive voltage is greater than a width of the second period TP2 where the gate1 start signal Sc1-Vst has the logic low voltage Vl of a negative voltage, the positive ion PI is repelled from the second signal line SL2. As a result, deterioration of the insulating layer INS and deterioration such as a bending crack are prevented.

It will be illustrated with drawings whether the display device is deteriorated.

Figure 8A:
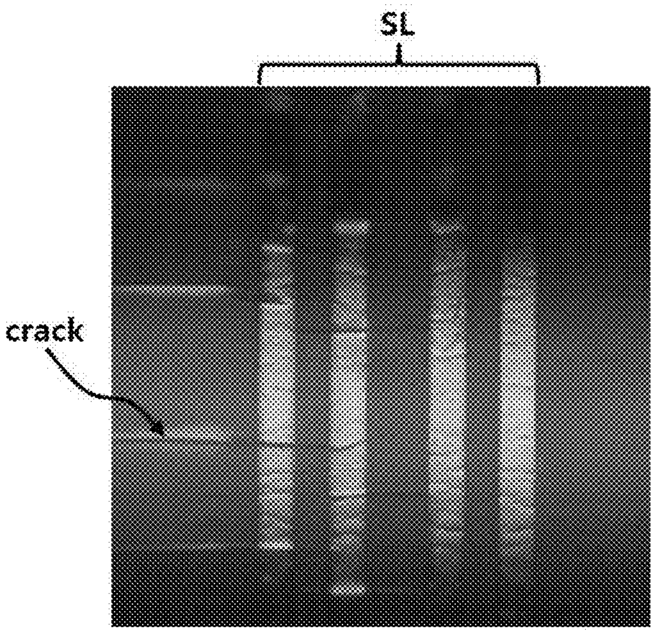
FIG. 8A is a view showing a signal line of a display device according to a comparison example.
Figure 8B:
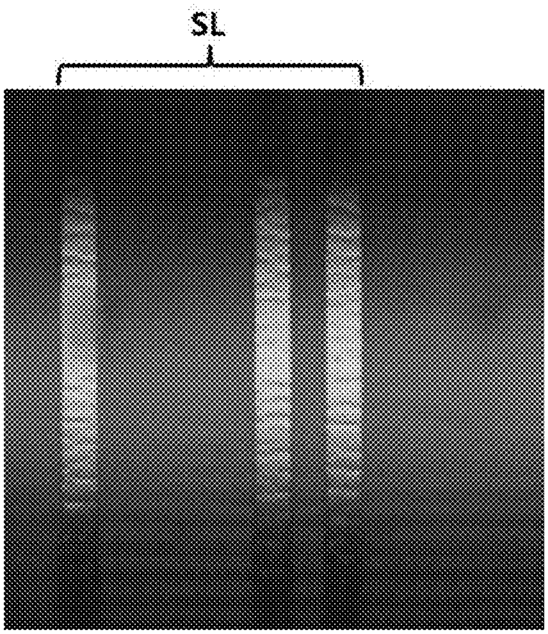
FIG. 8B is a view showing a signal line of a display device according to an embodiment of the present disclosure.

FIG. 7 is a table showing a test result of a display device according to an embodiment of the present disclosure, FIG. 8A is a view showing a signal line of a display device according to a comparison example, and FIG. 8B is a view showing a signal line of a display device according to an embodiment of the present disclosure.

In FIG. 7, the gate1 start signal Sc1-Vst having a plurality of pulses between a logic high voltage Vh of about 6.2V and a first logic low voltage Vl1 of about −11.6V is applied to a second signal line SL2 of a first kind of a case 1, and the gate1 start signal Sc1-Vst having a plurality of pulses between a logic high voltage Vh of about 6.2V and a second logic low voltage Vl2 of about −11.6V is applied to a second signal line SL2 of a second kind of a case 1. When the display device 110 of the case 1 is driven for about 168 hours, about 336 hours and about 504 hours under a condition of about 65° C. and about 90%, 0 sample is judged as a defective product (0F) and 10 samples are judged as a good product.

The gate1 start signal Sc1-Vst having a plurality of pulses between a logic high voltage Vh of about 6.2V and a first logic low voltage Vl1 of about −9.0V is applied to a second signal line SL2 of a first kind of a case 2, and the gate1 start signal Sc1-Vst having a plurality of pulses between a logic high voltage Vh of about 6.2V and a second logic low voltage Vl2 of about −10.6V is applied to a second signal line SL2 of a second kind of a case 2. When the display device 110 of the case 2 is driven for about 168 hours, about 336 hours and about 504 hours under a condition of about 65° C. and about 90%, 0 sample is judged as a defective product (0F) and 10 samples are judged as a good product.

In FIG. 8A, the insulating layer INS and/or the signal line SL are deteriorated due to the positive ion PI on the insulating layer INS to cause a crack in the display device according to a comparison example where the gate1 start signal Sc1-Vst of the logic low voltage Vl is applied to the signal line SL during the anode reset subframe SFar.

In FIG. 8B, the positive ion PI on the insulating layer INS is repelled from the signal line SL or the positive ion PI remains on the insulating layer INS in the display device 110 according to an embodiment of the present disclosure where the gate1 start signal Sc1-Vst having a plurality of pulses between the logic high voltage Vh and the logic low voltage Vl. As a result, deterioration of the insulating layer INS and/or the signal line SL is reduced or minimized and deterioration such as a crack is prevented.

Consequently, in a display device according to an embodiment of the present disclosure, since the gate control signal alternately has the logic high voltage and the logic low voltage during the anode reset subframe where generation of the gate signal is stopped, deterioration of the insulating layer on the signal line is reduced or minimized, deterioration such as the bending crack is prevented, and the reliability is improved.

Further, since the gate control signal has the period of the logic high voltage longer than the period of the logic low voltage during the anode reset subframe, the signal line transmitting the gate control signal has the repulsive force greater than the attractive force to the positive ion. As a result, deterioration such as the bending crack is prevented, and the reliability is improved.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. A display device, comprising:

a timing controlling circuit configured to generate an image data, a data control signal and a gate control signal;

a data driving circuit configured to generate a data signal using the image data and the data control signal;

a gate driving circuit configured to generate a gate signal using the gate control signal; and a display panel configured to display an image using the data signal and the gate signal, wherein a start signal of the gate control signal has one pulse between a logic high voltage and a logic low voltage during a refresh subframe where the data signal and the gate signal are supplied, and the start signal of the gate control signal has a plurality of pulses between the logic high voltage and the logic low voltage during an anode reset subframe where supply of the data signal and the gate signal is stopped, and wherein a clock of the gate control signal has a plurality of pulses between the logic high voltage and the logic low voltage during the refresh subframe, and the clock of the gate control signal has the logic high voltage during the anode reset subframe.

2. The display device of claim 1, wherein the start signal of the gate control signal has the logic high voltage during a first period of the anode reset subframe, and the start signal of the gate control signal has the logic low voltage during a second period of the anode reset subframe, and wherein a width of the first period is equal to or greater than a width of the second period.

3. The display device of claim 1, wherein the gate signal includes a gate1 signal, an odd gate2 signal, an even gate2 signal, a gate3 signal, a gate4 signal and an emission signal, wherein the start signal of the gate control signal includes a gate1 start signal for generating the gate1 signal, and wherein the clock of the gate control signal includes a gate1 clock for generating the gate1 signal.

4. The display device of claim 1, wherein the gate signal includes a gate1 signal, an odd gate2 signal, an even gate2 signal, a gate3 signal, a gate4 signal and an emission signal, wherein the display panel includes a plurality of subpixels, and wherein each of the plurality of subpixels comprises:

a storage capacitor connected to a high-level voltage;

a first transistor that switches according to a voltage of a first capacitor electrode of the storage capacitor;

a second transistor that switches according to one of the odd gate2 signal and the even gate2 signal, the second transistor connected to the data signal and the first transistor;

a third transistor that switches according to the gate1 signal, the third transistor connected to the storage capacitor and the first transistor;

a fourth transistor that switches according to the gate4 signal, the fourth transistor connected to the storage capacitor and an initial voltage;

a fifth transistor that switches according to the emission signal, the fifth transistor connected to the high-level voltage and the first transistor;

a sixth transistor that switches according to the emission signal, the sixth transistor connected to the first transistor;

a seventh transistor that switches according to the gate3 signal, the seventh transistor connected to an anode reset voltage and the sixth transistor;

an eighth transistor that switches according to the gate3 signal, the eighth transistor connected to a stress voltage and the first transistor; and a light emitting diode connected between the sixth transistor and a low-level voltage.

5. The display device of claim 4, wherein at least one of the first transistor, the second transistor, the third transistor, the fourth transistor, the fifth transistor, the sixth transistor, the seventh transistor, and the eighth transistor is an oxide semiconductor thin film transistor.

6. The display device of claim 4, wherein a first node connected to the first transistor, second transistor, fifth transistor, and eighth transistor, a second node connected to the first transistor, third transistor, fourth transistor, and the storage capacitor, a third node connected to the first transistor, third transistor and sixth transistor, and a fourth node connected to the sixth transistor, seventh transistor, and the light emitting diode are reset during the refresh subframe, and wherein the first node, third node, and fourth node are reset during the anode reset subframe.

7. The display device of claim 1, wherein a signal line that transmits the start signal of the gate signal is in a non-display area on a substrate of the display panel, wherein an insulating layer is on the signal line, and wherein a positive ion is on the insulating layer.

8. A method of driving a display device including a timing controlling circuit configured to generate an image data, a data control signal and a gate control signal, a data driving circuit configured to generate a data signal using the image data and the data control signal, a gate driving circuit configured to generate a gate signal using the gate control signal, and a display panel configured to display an image using the data signal and the gate signal, the method comprising:

supplying the data signal and the gate signal by the data driving circuit and the gate driving circuit, respectively, during a refresh subframe; and stopping supply of the data signal and the gate signal by the data driving circuit and the gate driving circuit, wherein a start signal of the gate control signal has one pulse between a logic high voltage and a logic low voltage during the refresh subframe and the start signal of the gate control signal has a plurality of pulses between the logic high voltage and the logic low voltage during an anode reset subframe, and wherein a clock of the gate control signal has a plurality of pulses between the logic high voltage and the logic low voltage during the refresh subframe, and the clock of the gate control signal has the logic high voltage during the anode reset subframe.

9. The method of claim 8, wherein the start signal of the gate control signal has the logic high voltage during a first period of the anode reset subframe and the start signal of the gate control signal has the logic low voltage during a second period of the anode reset subframe, and wherein a width of the first period is equal to or greater than a width of the second period.

10. A display device, comprising:

a timing controlling circuit configured to generate an image data, a data control signal and a gate control signal;

a data driving circuit configured to generate a data signal using the image data and the data control signal;

a gate driving circuit configured to generate a gate signal using the gate control signal; and a display panel configured to display an image using the data signal and the gate signal, wherein a start signal of the gate control signal transmitted from the timing controlling circuit to the gate driving circuit has one pulse between a logic high voltage and a logic low voltage during a refresh subframe where the data signal and the gate signal are supplied, and the start signal of the gate control signal has a plurality of pulses between the logic high voltage and the logic low voltage during an anode reset subframe where supply of the data signal and the gate signal is stopped.

11. The display device of claim 10, wherein a signal line that transmits the start signal of the gate signal is in a non-display area on a substrate of the display panel, wherein an insulating layer is on the signal line, and wherein a positive ion is on the insulating layer.

* * * * *